United States Patent
Xu et al.

(10) Patent No.: US 11,719,748 B2
(45) Date of Patent: *Aug. 8, 2023

(54) METHOD OF TESTING MEMORY DEVICE EMPLOYING LIMITED NUMBER OF TEST PINS AND MEMORY DEVICE UTILIZING SAME

(71) Applicant: YANGTZE MEMORY TECHNOLOGIES CO., LTD., Wuhan (CN)

(72) Inventors: Xiaodong Xu, Wuhan (CN); Xiangming Zhao, Wuhan (CN); Shunlin Liu, Wuhan (CN); Yi Chen, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 102 days.

This patent is subject to a terminal disclaimer.

(21) Appl. No.: 17/399,033

(22) Filed: Aug. 10, 2021

(65) Prior Publication Data
US 2021/0364570 A1 Nov. 25, 2021

Related U.S. Application Data

(63) Continuation of application No. 16/726,098, filed on Dec. 23, 2019, now Pat. No. 11,125,816, which is a
(Continued)

(51) Int. Cl.
*G01R 31/28* (2006.01)
*G01R 31/317* (2006.01)
(Continued)

(52) U.S. Cl.
CPC ........ *G01R 31/31713* (2013.01); *G01R 31/318572* (2013.01); *G11C 7/222* (2013.01); *G11C 29/023* (2013.01)

(58) Field of Classification Search
CPC ...... G01R 31/31713; G01R 31/318572; G11C 7/222; G11C 29/023
See application file for complete search history.

(56) References Cited

U.S. PATENT DOCUMENTS

| 6,031,391 A | 2/2000 | Couts-Martin et al. |
| 6,950,325 B1* | 9/2005 | Chen .............. G11C 17/10 365/185.12 |

(Continued)

FOREIGN PATENT DOCUMENTS

| CN | 1633602 A | 6/2005 |
| CN | 101042939 A | 9/2007 |

(Continued)

*Primary Examiner* — Christine T. Tu
(74) *Attorney, Agent, or Firm* — Bayes PLLC

(57) ABSTRACT

A memory device includes a plurality of pins, a controller die coupled to the isolation pin, and a memory die. The plurality of pins include an isolation pin, a test mode select pin configured to switch an operation mode of the memory die, a test clock pin configured to receive a test clock, and a test data pin configured to perform a data transmission. The controller die is coupled to the isolation pin. The memory die is coupled to the test mode select pin, the test clock pin, and the test data pin.

20 Claims, 5 Drawing Sheets

Related U.S. Application Data continuation of application No. PCT/CN2019/111614, filed on Oct. 17, 2019.

(51) Int. Cl.
*G01R 31/3185* (2006.01)
*G11C 7/22* (2006.01)
*G11C 29/02* (2006.01)

(56) References Cited

U.S. PATENT DOCUMENTS

| | | | |
|---|---|---|---|
| 7,346,784 | B1 | 3/2008 | Theron |
| 8,539,290 | B2 | 9/2013 | Burggraf, III |
| 2002/0006066 | A1* | 1/2002 | Kim ............... G11C 29/14 365/201 |
| 2005/0099199 | A1 | 5/2005 | Sugita et al. |
| 2005/0162182 | A1 | 7/2005 | Ong |
| 2005/0240842 | A1 | 10/2005 | Yonaga |
| 2008/0079455 | A1 | 4/2008 | Vollrath et al. |
| 2013/0036255 | A1 | 2/2013 | Fai et al. |
| 2015/0043291 | A1 | 2/2015 | Kim |
| 2015/0325314 | A1 | 11/2015 | Ziaja et al. |
| 2016/0225465 | A1 | 8/2016 | Qian |
| 2019/0139620 | A1 | 5/2019 | Lee |
| 2019/0302181 | A1* | 10/2019 | Dono ............... G11C 29/1201 |

FOREIGN PATENT DOCUMENTS

| | | |
|---|---|---|
| CN | 101166986 A | 4/2008 |
| CN | 101548337 A | 9/2009 |
| CN | 105679372 A | 6/2016 |
| CN | 107545915 A | 1/2018 |
| CN | 108122592 A | 6/2018 |
| CN | 109801666 A | 5/2019 |
| JP | 2008537999 A | 10/2008 |
| JP | 2010135819 A | 6/2010 |
| KR | 10-20060105228 A | 10/2006 |
| TW | 201440513 A | 10/2014 |
| TW | 201518747 A | 5/2015 |
| WO | 2002075341 A1 | 9/2002 |
| WO | 2006108439 A1 | 10/2006 |

* cited by examiner

METHOD OF TESTING MEMORY DEVICE EMPLOYING LIMITED NUMBER OF TEST PINS AND MEMORY DEVICE UTILIZING SAME

CROSS REFERENCE TO RELATED APPLICATIONS

This application is a continuation of U.S. application Ser. No. 16/726,098, filed on Dec. 23, 2019, issued as U.S. Pat. No. 11,125,816, entitled "METHOD OF TESTING MEMORY DEVICE EMPLOYING LIMITED NUMBER OF TEST PINS AND MEMORY DEVICE UTILIZING SAME," which is a continuation of International Application No. PCT/CN2019/111614, filed on Oct. 17, 2019, all of which are incorporated herein by reference in their entireties.

BACKGROUND

The disclosure relates to semiconductor testing, and specifically, to a method of testing a memory device employing a limited number of test pins, and the memory device utilizing the same.

Non-volatile memory such as flash memory has been widely adopted in communications and consumer electronics systems owing to its compact physical size and repetitively programming capability. The reliability of the non-volatile memory must be checked in factory testing to ensure that data can be reliably read from or written into the non-volatile memory. In practice, a non-volatile memory device such as an embedded multi-media card (eMMC) or a universal flash storage (UFS) may contain more than one memory unit that can only be accessed indirectly via an intermediate circuit such as a memory controller.

Therefore, a memory device whose memory units are directly accessible from external and a testing method thereof are in need.

SUMMARY

According to one embodiment, a memory device includes a package substrate, a controller die, and a memory die. The package substrate includes an isolation pin, a test mode select pin used to switch an operation mode of a memory die, a test clock pin used to receive a test clock, and a test data pin used to perform a data transmission. The controller die is disposed on the package substrate and coupled to the isolation pin. The memory die is disposed on the package substrate and coupled to the test mode select pin, the test clock pin and the test data pin. When the isolation pin is set to an isolation state to isolate the memory die from the controller die, the memory die is set to receive control via the test mode select pin, the test clock pin and the test data pin.

According to another embodiment, a memory device includes a package substrate, a controller die, and a memory die. The package substrate includes an isolation pin, a test enable pin, a test mode select pin used to switch an operation mode of a memory die, a test clock pin used to receive a test clock, and a test data pin used to perform a data transmission. The controller die is disposed on the package substrate and coupled to the isolation pin. The memory die is disposed on the package substrate and coupled to the test enable pin, the test mode select pin, the test clock pin and the test data pin. When the isolation pin is set to an isolation state to isolate the memory die from the controller die and the test enable pin is set to a test enable state, the memory die is set to receive control via the test mode select pin, the test clock pin and the test data pin.

According to yet another embodiment, a method is used to test a memory device including a package substrate, a controller die and a memory die. The package substrate includes an isolation pin, a test mode select pin, a test clock pin and a test data pin. The method includes setting the isolation pin to an isolation state to isolate the memory die from the controller die, and when the isolation pin is set to the isolation state, setting the memory die to receive control via the test mode select pin, the test clock pin and the test data pin.

These and other objectives of the present disclosure will no doubt become obvious to those of ordinary skill in the art after reading the following detailed description of the preferred embodiment that is illustrated in the various figures and drawings.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

DETAILED DESCRIPTION

Figure 1:
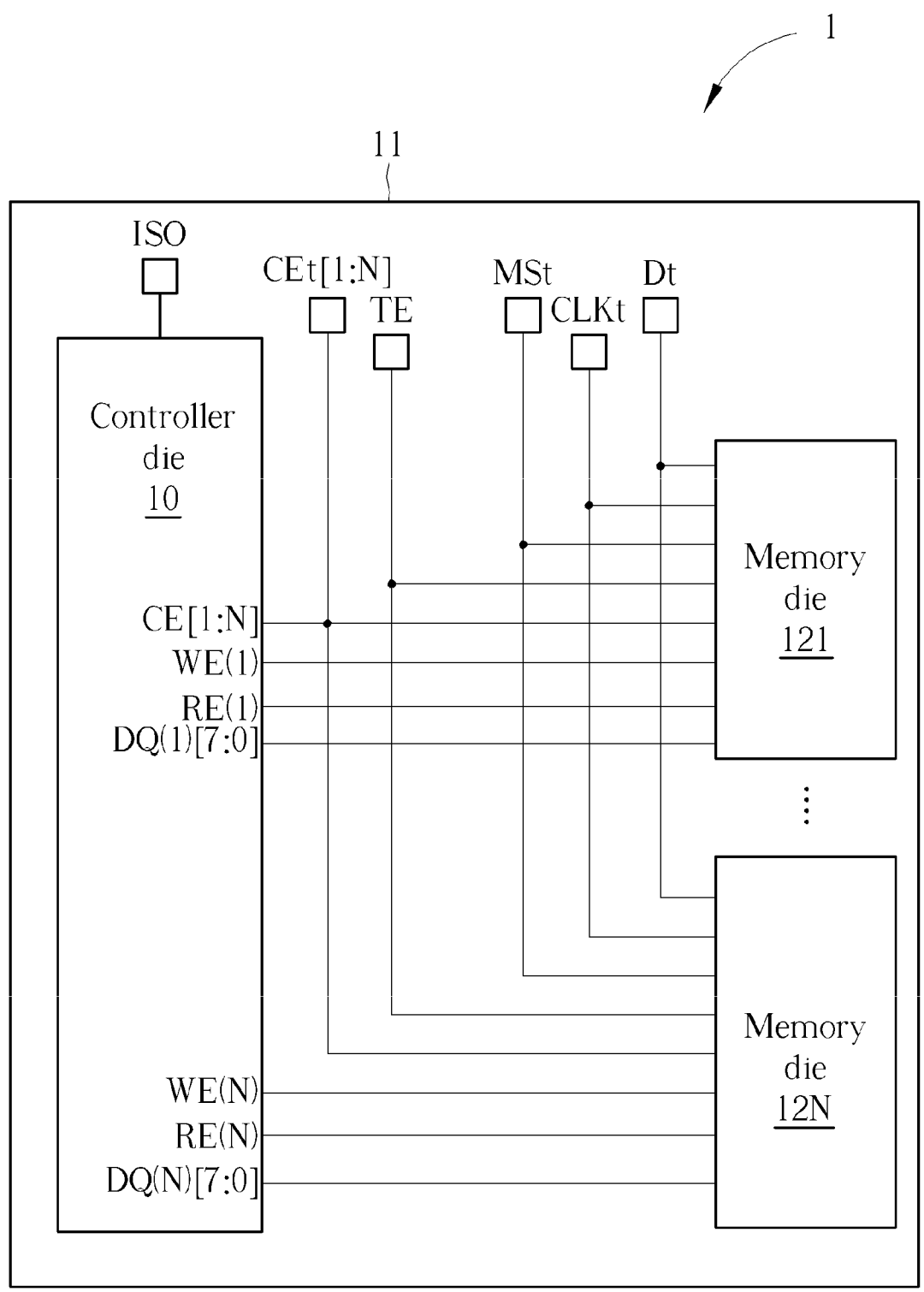
FIG. 1 is a block diagram of a memory device according to an embodiment of the disclosure.

FIG. 1 is a block diagram of a memory device 1 according to an embodiment of the disclosure. The memory device comprises a package substrate 11, a controller die 10 and memory dies 121 to 12N, N being a positive integer, e.g., N=4 for 4 memory dies 121 to 124. The memory device 1 may be an embedded multi-media card (eMMC) device or a universal flash storage (UFS) device. The memory dies 121 to 12N may be NAND flash memory dies. The controller die 10 and the memory dies 121 to 12N may be held in a package and disposed on the package substrate 11. The package substrate 11 may include an isolation pin ISO, a test enable pin TE, test chip enable pins CEt[1:N], a test mode select pin MSt, a test clock pin CLKt and a test data pin Dt for external test equipment to directly access the memory dies 121 to 12N without passing through the controller die 10. The controller die 10 may include chip enable pins CE[1:N], write enable pins WE(1) to WE(N), read enable pins RE(1) to RE(N), data pins DQ(1)[7:0] to DQ(N)[7:0] and other pins to access the memory dies 121 to 12N. The controller die 10 may be coupled to the isolation pin ISO. The memory dies 121 to 12N may be coupled to the test enable pin TE, the test chip enable pins CEt[1:N], the test mode select pin MSt, the test clock pin CLKt and the test data pin Dt on the package substrate 11. Further, each memory die 12n may be coupled to the chip enable pin CE[n], a write enable pin WE(n), a read enable pin RE(n), data pins DQ(n)[7:0] and the other pins of the controller 10, n being a positive integer and n≤N.

The memory device 1 may operate in a normal mode or a test mode. In the normal mode, the controller die 10 is coupled to each memory die 12n via the chip enable pin CE[n], the write enable pin WE(n), the read enable pin RE(n), the data pins DQ(n)[7:0] and the other pins corresponding to the memory die 12n to control access to each memory die 12n. In the test mode, the test equipment may set the isolation pin ISO to an isolation state to isolate each memory die 12n from the controller die 10 by disconnecting each memory die 12n from the chip enable pin CE[n], the write enable pin WE(n), the read enable pin RE(n), the data pins DQ(n)[7:0] and other pins of the controller die 10, and set the test enable pin TE to a test enable state for each memory die 12n to receive control directly from the test equipment via the test mode select pin MSt, the test clock pin CLKt, the test data pin Dt and the test chip enable pin CEt[n]. In some embodiments, the isolation state may be a logical high level, and the test enable state may be the logical high level. In some embodiments, the test enable pin TE may be realized by multi-die select pins MDS[3:0]. The multi-die select pins MDS[3:0] may be used to address individual memory dies 121 to 12N using unique addresses. In some embodiments, the multi-die select pins MDS[3:0] may all be set to the logical high level, so as to enable the memory dies 121 to 12N for testing. The memory dies 121 to 12N may be tested in turn by setting respective test chip enable pins CEt[1:N] to the logical low level sequentially.

Specifically, in the test mode, the test equipment may configure the test chip enable pins CEt[1:N] to enable the respective memory dies 121 to 12N, configure the test mode select pin MSt to switch operation modes of the respective memory dies 121 to 12N, configure the test clock pin CLKt to transmit a test clock to the respective memory dies 121 to 12N, and configure the test data pin Dt to perform data transmissions on the respective memory dies 121 to 12N. The test chip enable pins CEt[1:N] may be held at a logical low level to enable the respective memory dies 121 to 12N. The data transmissions may be associated with a reading access or a writing access to the respective memory dies 121 to 12N.

Figure 2:
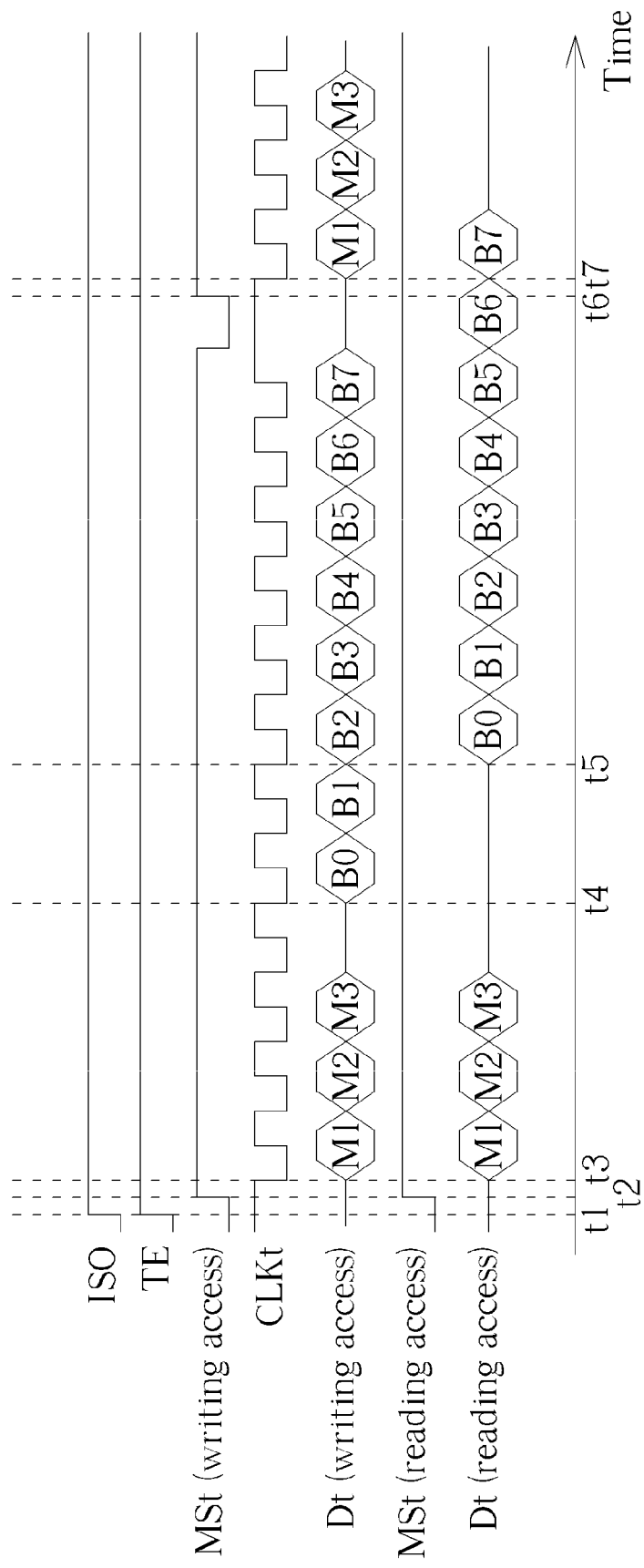
FIG. 2 shows a timing diagram of selected signals of the memory device in FIG. 1.

FIG. 2 shows a timing diagram of selected signals on the isolation pin ISO, the test enable pin TE, the test mode select pin MSt, the test clock pin CLKt and the test data pin Dt on the package substrate 11. At Time t1, the isolation pin ISO and the test enable pin TE are set to the logical high level by the test equipment to set the memory die 12n to the test mode. At Time t2, the test mode select pin MSt receives a mode switching waveform from the test equipment, signifying that mode switching of the data transmission on the test data pin Dt will start subsequently. The mode switching waveform received by the test mode select pin MSt may be a "high-low-high" pattern. At Time t3, the test data pin Dt receives a mode code (M1, M2, M3) from the test equipment, while the test clock pin CLKt receives a clock signal for retrieving the mode code and performing the subsequent data transmission. The mode code (M1, M2, M3) is 3-bit data indicating a mode of a subsequent data transmission, e.g., a mode code (0, 0, 1) may indicate a command mode, a mode code (0, 1, 0) may indicate an address mode, and a mode code (0, 1, 1) may indicate a data mode. In the case of a writing access, at Time t3, the mode code (M1, M2, M3) on the test data pin Dt may be (0, 1, 0) indicating that the subsequent data transmission will carry a writing address, and at Time t4, the test data pin Dt receives 8-bit address B0 to B7 from the test equipment and transmits the same to the memory die 12n. At Time t6, the test mode select pin MSt receives the mode switching waveform signifying another mode switching, and at Time t7, the test data pin Dt receives a mode code (M1, M2, M3) indicating the next data access, e.g., a mode code (0, 1, 1) indicating that the subsequent data transmission will include data to be written. In some embodiments, if at Time t6, no mode switching waveform is detected on the test mode select pin MSt, the test mode select pin MSt may continuously receive the next 8-bit address until the mode switching waveform is detected. In the case of a reading access, at Time t3, the mode code (M1, M2, M3) may be (0, 1, 0) indicating that the subsequent data transmission will include read data, and at Time t5, the test data pin Dt receives 8-bit data B0 to B7 from the memory die 12n and transmits the same to the test equipment.

Figure 3:
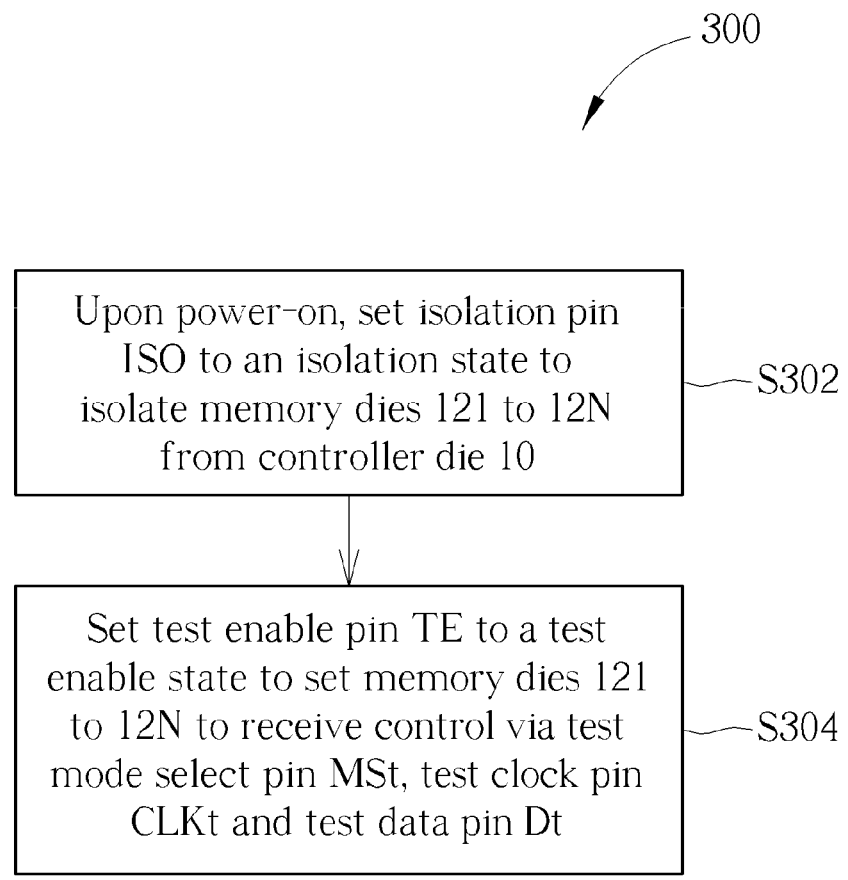
FIG. 3 is a flowchart of a testing method applicable to the memory device in FIG. 1.

FIG. 3 is a flowchart of a testing method 300 applicable to the memory device 1. The testing method 300 comprises Steps S302 and S304 for testing the memory dies 121 to 12N in the memory device 1, wherein Step S302 is used to isolate the memory dies 121 to 12N from the controller die 10, and Step S304 is used to set the memory dies 121 to 12N in the test mode. Any reasonable step change or adjustment is within the scope of the disclosure. Steps S302 and S304 are provided as follows:

S302: Upon power-on, set the isolation pin ISO to the isolation state to isolate the memory dies 121 to 12N from the controller die 10;

S304: Set the test enable pin TE to the test enable state to set the memory dies 121 to 12N to receive control via the test mode select pin MSt, the test clock pin CLKt and the test data pin Dt.

Details of Steps S302 and S304 are described in the preceding paragraphs and will not be repeated here for brevity. In the test mode, the test equipment may set the chip enable pins CE[1:N] to the logical low level in sequence, while applying test patterns to and receiving test results from the memory dies 121 to 12N sequentially, thereby completing factory tests for a large quantity of memory dies in a thorough and efficient manner.

The memory device 1 and testing method 300 employ (5+N) pins (the isolation pin ISO, the test enable pin TE, the test chip enable pins CEt[1:N], the test mode select pin MSt, the test clock pin CLKt and the test data pin Dt) to implement a test mode, employing a limited number of test pins on the package of the memory device 1, allowing simultaneous tests for a large quantity of memory devices 1, and decreasing the time required in a factory test.

Figure 4:
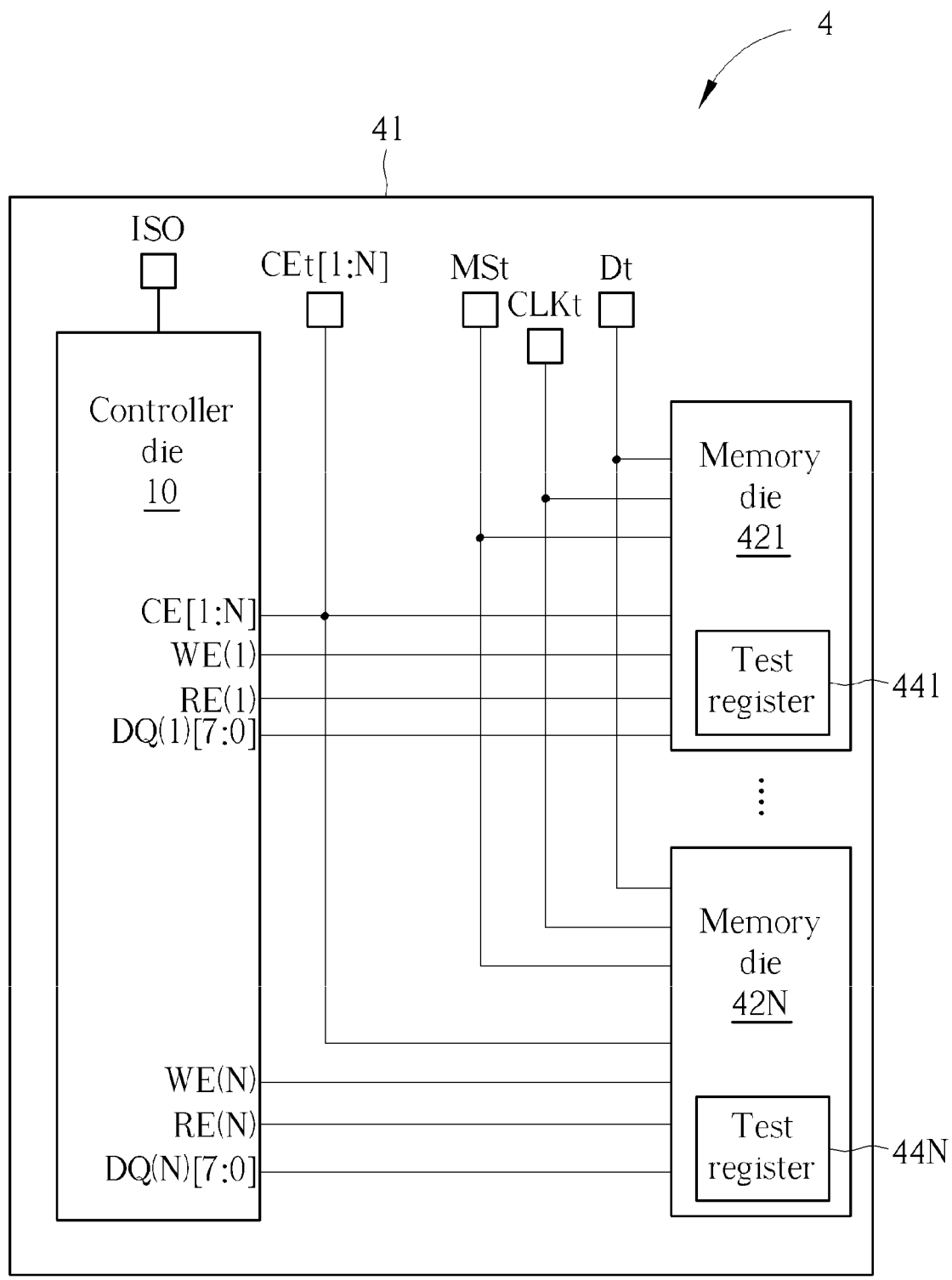
FIG. 4 is a block diagram of another memory device according to an embodiment of the disclosure.

FIG. 4 is a block diagram of another memory device 4 according to an embodiment of the disclosure. The circuit configurations and operations of the memory device 4 are similar to those in the memory device 1, except that the test enable pin TE is omitted from a package substrate 41 and additional test registers 441 to 44N are adopted in respective memory dies 421 to 42N to set the test mode. Explanations for the isolation pin ISO, the test chip enable pins CEt[1:N], the test mode select pin MSt, the test clock pins CLKt, the test data pin Dt, the chip enable pins CE[1:N], the write enable pins WE(1) to WE(N), the read enable pins RE(1) to RE(N), and the data pins DQ(1)[7:0] to DQ(N)[7:0] are identical to those in FIG. 1 and will be omitted for brevity. The following explanation will focus on the circuit configurations and operations of the test register 441 to 44N.

The controller die 10 may have an internal or external memory storing test firmware. The write enable pins WE(1) to WE(N) may be active low pins. Upon power-on, the controller 10 may load the test firmware from the internal or external memory, set the write enable pins WE(1) to WE(N)

to the logical low level, and write a test enable state into the test registers 441 to 44N according to the test firmware and via the data pins DQ(1)[7:0] to DQ(N)[7:0]. The test enable state may be a logical high ("1") or a logical low ("0"), e.g., the controller 10 may write "1" into the test registers 441 to 44N at respective memory addresses. Upon completion of setting the test registers 441 to 44N to the test enable state, the isolation pin ISO may be set to the isolation state to isolate the memory dies 421 to 42N from the controller die 10. In some embodiments, the isolation pin ISO may be set by the controller 10 according to the test firmware. In other embodiments, the isolation pin ISO may be set by test equipment external to the memory device 1. Later, the memory dies 421 to 42N may read the test enable state from the test registers 441 to 44N and enter a test mode, in which the memory dies 421 to 42N may receive control directly from the test equipment via the test mode select pin MSt, the test clock pin CLKt, the test data pin Dt and the test chip enable pins CEt[1:N]. The operations of the test mode select pin MSt, the test clock pin CLKt and the test data pin Dt are similar to those in FIG. 2 and will not be repeated here.

Compared to the memory device 1, the memory device 4 employs 1 less pin on the package substrate 41 to implement the test mode, further reducing the number of test pins on the package, allowing simultaneous tests for a large quantity of memory devices 4, and decreasing the time required in a factory test.

Figure 5:
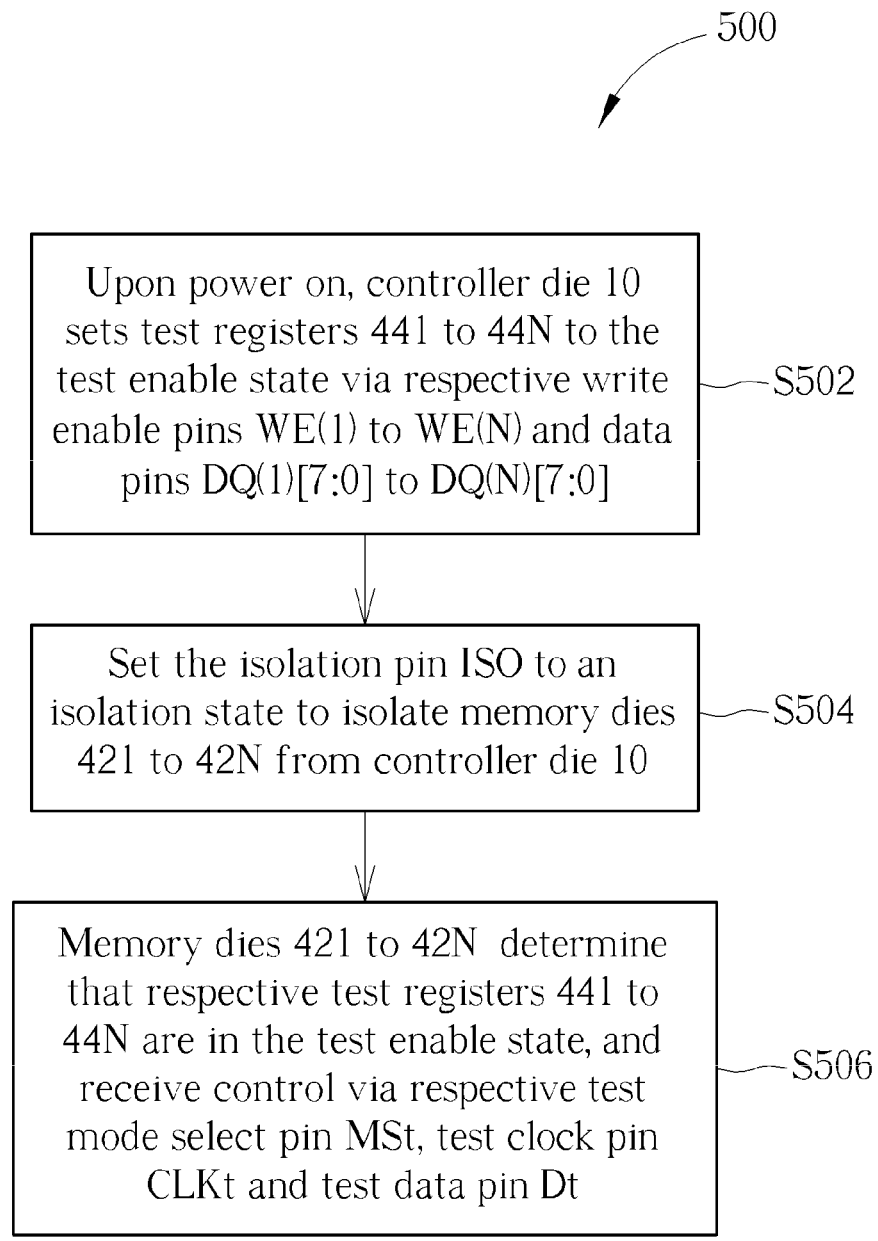
FIG. 5 is a flowchart of a testing method applicable to the memory device in FIG. 4.

FIG. 5 is a flowchart of a testing method 500 applicable to the memory device 4. The testing method 500 comprises Steps S502 to S506 for testing the memory dies 421 to 42N in the memory device 4, wherein Step S502 is used to set the test registers 441 to 44N to the test enable state, Step S504 is used to isolate the memory dies 421 to 42N from the controller die 10, and Step S506 is used to set the memory dies 121 to 12N to start the test mode. Any reasonable step change or adjustment is within the scope of the disclosure. Steps S502 to S506 are provided as follows:

S502: Upon power on, the controller die 10 sets the test registers 441 to 44N to the test enable state via the respective write enable pins WE(1) to WE(N) and data pins DQ(1)[7:0] to DQ(N)[7:0];

S504: Set the isolation pin ISO to the isolation state to isolate the memory dies 421 to 42N from the controller die 10;

S506: The memory dies 421 to 42N determine that the respective test registers 441 to 44N are in the test enable state, and receive control via respective the test mode select pin MSt, the test clock pin CLKt and the test data pin Dt.

Details of Steps S502 and S506 are described in the preceding paragraphs and will not be repeated here for brevity. Rather than setting a test enable pin to the test enable state as disclosed in the method 300, the method 500 sets the test registers 441 to 44N to the test enable state, employing a further reduced number of test pins on the package while delivering the test functionality.

The memory devices 1, 4 and testing methods 300, 500 employ a limited number of test pins on the package to implement a test mode, allowing simultaneous tests for a large quantity of memory devices 1, 4, and decreasing the time required in a factory test.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A memory device comprising:
   a plurality of pins, comprising:
     an isolation pin;
     a test mode select pin configured to switch an operation mode of a memory die;
     a test clock pin configured to receive a test clock; and
     a test data pin configured to perform a data transmission;
   a controller die coupled to the isolation pin, wherein the isolation pin is configured to provide an isolation control signal to indicate whether the memory die is to be isolated from the controller die; and
   the memory die coupled to the test mode select pin, the test clock pin, and the test data pin.

2. The memory device of claim 1, wherein in response to the isolation pin being set to an isolation state to isolate the memory die from the controller die, the memory die is controlled via the test mode select pin, the test clock pin and the test data pin.

3. The memory device of claim 1, wherein the memory die comprises a test register.

4. The memory device of claim 3, wherein:
   the controller die comprises a write enable pin and a data pin;
   the test register of the memory die is coupled to the write enable pin and the data pin;
   the test register is set to a test enable state by the controller die via the write enable pin and the data pin; and
   after the test register is set to the test enable state, the isolation pin is set to an isolation state to isolate the memory die from the controller die.

5. The memory device of claim 1, wherein the plurality of pins further comprise a chip enable pin coupled to the memory die, and configured to transmit a chip enable signal to the memory die for enabling the memory die.

6. The memory device of claim 1, wherein the data transmission is associated with a reading access to the memory die.

7. The memory device of claim 1, wherein the data transmission is associated with a writing access to the memory die.

8. A memory device comprising:
   a plurality of pins, comprising:
     an isolation pin;
     a test enable pin;
     a test mode select pin configured to switch an operation mode of a memory die;
     a test clock pin configured to receive a test clock; and
     a test data pin configured to perform a data transmission;
   a controller die coupled to the isolation pin, wherein the isolation pin is configured to provide an isolation control signal to indicate whether the memory die is to be isolated from the controller die; and
   the memory die coupled to the test enable pin, the test mode select pin, the test clock pin, and the test data pin.

9. The memory device of claim 8, wherein in response to the isolation pin being set to an isolation state to isolate the memory die from the controller die and the test enable pin being set to a test enable state, the memory die is controlled via the test mode select pin, the test clock pin, and the test data pin.

10. The memory device of claim 8, wherein the plurality of pins further comprises a chip enable pin coupled to the memory die, and configured to transmit a chip enable signal to the memory die for enabling the memory die.

11. The memory device of claim 8, wherein the data transmission is associated with a reading access to the memory die.

12. The memory device of claim 8, wherein the data transmission is associated with a writing access to the memory die.

13. A method of testing a memory device, the memory device comprising a plurality of pins, a controller die, and a memory die, the plurality of pins comprising an isolation pin, a test mode select pin, a test clock pin, and a test data pin, the method comprising:
   setting the isolation pin to an isolation state to isolate the memory die from the controller die; and
   in response to the isolation pin being set to the isolation state, controlling the memory die via the test mode select pin, the test clock pin, and the test data pin.

14. The method of claim 13, wherein:
   the controller die comprises a write enable pin and a data pin;
   the memory die comprises a test register coupled to the write enable pin and the data pin;
   the method further comprises setting the test register to a test enable state by the controller die via the write enable pin and the data pin; and
   after the test register is set to the test enable state, the isolation pin is set to the isolation state.

15. The method of claim 13, wherein:
   the plurality of pins further comprise a chip enable pin coupled to the memory die; and
   the method further comprises transmitting, via the chip enable pin, a chip enable signal to the memory die for enabling the memory die.

16. The method of claim 13, wherein:
   the plurality of pins further comprises a test enable pin;
   the method further comprises setting the test enable pin to a test enable state; and
   in response to the isolation pin being set to the isolation state and the test enable pin being set to the test enable state, the memory die is controlled via the test mode select pin, the test clock pin, and the test data pin.

17. The method of claim 13, wherein controlling the memory die via the test mode select pin, the test clock pin, and the test data pin comprises:
   setting the test mode select pin to switch an operation mode of the memory die;
   setting the test clock pin to receive a test clock; and
   setting the test data pin to perform a data transmission.

18. The method of claim 13, wherein
   setting the isolation pin to the isolation state comprises setting the isolation pin to a logical high level at a first timestamp; and
   controlling the memory die via the test mode select pin, the test clock pin, and the test data pin comprises:
      at a second timestamp, receiving a first mode switching waveform through the test mode select pin to indicate a first mode switching of a data transmission on the test data pin; and
      at a third timestamp, receiving a first mode code through the test data pin, and receiving a clock signal through the test clock pin.

19. The method of claim 18, wherein controlling the memory die via the test mode select pin, the test clock pin, and the test data pin further comprises:
   in response to the first mode code indicating that the data transmission carries a writing address, at a fourth timestamp, receiving the writing address from a test equipment through the test data pin, and transmitting the writing address to the memory die through the test data pin; or
   in response to the first mode code indicating that the data transmission carries read data, at a fifth timestamp, receiving the read data from the memory die through the test data pin, and transmitting the read data to the test equipment through the test data pin.

20. The method of claim 19, wherein in response to the first mode code indicating that the data transmission carries the writing address, controlling the memory die via the test mode select pin, the test clock pin, and the test data pin further comprises:
   at a sixth timestamp, receiving a second mode switching waveform through the test mode select pin to indicate a second mode switching of the data transmission on the test data pin; and
   at a seventh timestamp, receiving a second mode code through the test data pin, the second mode code indicating that the data transmission carries data to be written into the writing address.

* * * * *